Inventor
Paul Peter Biringer
By Stevens Davis Miller & Mosher
Attorneys

Inventor
Paul Peter Biringer
By Stevens Davis Miller & Mosher
Attorneys

Inventor
Paul Peter Biringer
By Stevens Davis Miller & Mosher
Attorneys

Nov. 30, 1965 P. P. BIRINGER 3,221,244
STATIC FREQUENCY MULTIPLIERS
Filed Jan. 27, 1961 8 Sheets-Sheet 4

Inventor
Paul Peter Biringer
By Stevens Davis Miller & Mosher
Attorneys

Inventor
Paul Peter Biringer
By Stevens Davis Miller & Mosher
Attorneys

Nov. 30, 1965 P. P. BIRINGER 3,221,244

STATIC FREQUENCY MULTIPLIERS

Filed Jan. 27, 1961 8 Sheets-Sheet 6

Inventor
Paul Peter Biringer
By Stevens Davis Miller & Mosher
Attorneys

Inventor
Paul Peter Biringer
By Stevens Davis Miller + Mosher
Attorneys

Nov. 30, 1965 P. P. BIRINGER 3,221,244

STATIC FREQUENCY MULTIPLIERS

Filed Jan. 27, 1961 8 Sheets-Sheet 8

Inventor
Paul Peter Biringer
By Stevens Davis Miller & Mosher
Attorneys 3,221,244

STATIC FREQUENCY MULTIPLIERS

Paul Peter Biringer, Toronto, Ontario, Canada, assignor to Her Majesty the Queen in Right of Canada as represented by the Minister of National Defence Filed Jan. 27, 1961, Ser. No. 85,261
11 Claims. (Cl. 321—68)

The present invention relates to static frequency multipliers with particular reference to frequency multipliers employing saturable core transformers.

When it is necessary to increase the frequency of a power supply, particularly when a high load capacity is required, it is usual to employ rotary converter equipment. However, the use of a static frequency multiplier has the advantage that higher efficiency may be obtained from a device that is lower in weight for comparable regulation characteristics, and which, having no moving parts, greatly reduces maintenance costs, as compared with rotary equipment.

Present static frequency multipliers require direct current biassing of the transformer core. Alternating E.M.F.'s are induced into the winding through which the direct current flows by the alternating flux changes in the core, and a large choke connected in series with the direct current energizing line is thus needed to prevent the flow of the alternating currents through the direct current source.

According to one aspect of the invention, there is provided in a frequency multiplying circuit comprising a saturable core reactor, a D.C. source, and a biassing winding on the core of said reactor for carrying direct current from said source for magnetic biassing of said core; a choke in series with said winding and said source for reactance against alternating currents tending to be generated by alternating E.M.F.'s in said winding, said choke comprising, a ferro-magnetic flux path, a first winding linking said flux path, and being connected in series with said D.C. source and said biassing winding, a second winding linking the flux path, a second D.C. source connected to pass direct current though said second winding whereby to reduce magnetic biassing in said flux path caused by said direct current through the first winding, and means for adjusting the output of the second D.C. source.

According to another aspect of the invention there is provided a frequency multiplier comprising first and second saturable magnetic flux paths, a first primary and a first secondary winding linking the first flux path, a second primary and a second secondary winding linking the second flux path, each said winding having a first and a second end whereby direct current flow from the first to the second end of a winding tends to induce a flux in its flux path in the same direction in that path, means for serially connecting the primary windings across a source of alternating current, said second end of the first primary and the first end of the second primary being connected to form a junction, means connecting the first ends of said first primary and second secondary, means connecting the second ends of the second primary and first secondary; means for connecting the first end of the first secondary to the junction to form a first circuit of the second primary and the first secondary, means for connecting the second end of the second secondary to the junction to form a second circuit of the second secondary and the first primary, means for interposing a source of direct current in one of the first and second circuits and means for connecting a load in the other of the first and second circuits.

According to a further aspect of the invention there is provided a frequency multiplier comprising, first and second saturable magnetic flux paths, a first winding linking the first flux path, a primary and a secondary winding linking the second flux path, said primary and said secondary winding each having a first and a second end whereby direct current flow from the first to the second end of a winding tends to induce a flux in its flux path in the same direction in that path, means for permitting serial connection of the first winding and the primary winding across a source of alternating current, one end of the first winding and the first end of the primary winding being connected to form a junction, means connecting the first end of the secondary winding to the other end of the first winding, means connecting the second end of the secondary winding to the junction forming a circuit through said first winding and said secondary, means for interposing a source of direct current in said circuit and means for connecting a load in said circuit.

According to yet another aspect of the invention there is provided a self biassing frequency multiplier comprising, a pair of independent saturable magnetic flux paths, a winding on each said path, an alternating current source for providing an E.M.F. at as source frequency, a rectifier for each said winding, each said rectifier being series connected with its winding across the source in an opposite sense from the other rectifier whereby flux developed in said paths changes most rapidly in alternate paths during periods spaced in time by one half cycle of the source E.M.F. and means for obtaining E.M.F.'s from flux changes in said paths and for adding said obtained E.M.F.'s to provide an output E.M.F. which is a second harmonic of the source frequency.

According to another aspect of the invention there is provided a frequency multiplier for use with a source of alternating E.M.F. comprising four independent saturable magnetic flux paths, a winding linking each said flux path, means for connecting a chosen pair of said windings in series with one another and in series with a condenser across said source, means for connecting the other pair of said windings in series with one another and in series with a second condenser across said source, said condensers being chosen in reactance to establish currents in said first and second pair substantially 90° different in phase from one another, means for biasing said flux paths to obtain a greater flux change in one path of a pair during one half cycle of the current for that pair and the greater flux change in the other path during the other half cycle of the current for that pair, and means for obtaining E.M.F.'s generated by flux changes in said paths and for connecting the last mentioned E.M.F.'s to provide an output which is a second harmonic of the source E.M.F. frequency.

According to one aspect of the invention there is provided a method of operating a frequency multiplier having a plurality of saturable flux paths each having a primary winding linking the path, which comprises magnetically biassing said paths, applying an alternating E.M.F. to produce an alternating current through each primary winding whereby to develop a substantial change in the flux in each part at an individual chosen portion of the cycle of the primary current, inducing an E.M.F. for each path by the substantial change in flux said each path, and adding the E.M.F.'s induced to provide an output at a multiple of the applied alternating E.M.F. frequency.

In the description which follows reference will be made to the drawings, in which.

Let us firstly examine the operation of a known frequency doubler. In the analysis which follows the material of the core will be considered to be magnetically ideal and we shall assume that it BH curve has a trilinear shape of the form shown in FIGURE 2. $B_k$ represents the flux at the "knee" of the curve at which saturation occurs, points 13 and 14, and $H_k$ the magnetizing field to produce this flux. It will be seen that there is no hysteresis loop in this curve, but such an ideal approximation will give a good idea of the operation of the several circuits to be described.

Figure 1:
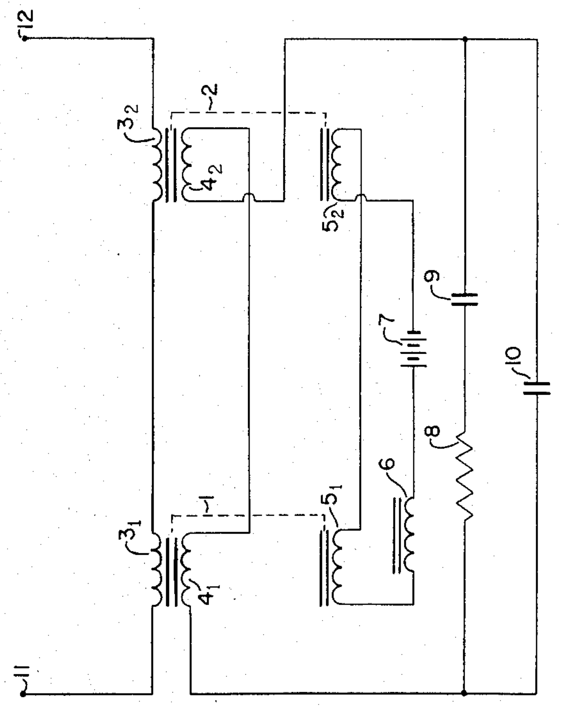
FIGURE 1 represents a schematic diagram of a known frequency doubler circuit.

In FIGURE 1 two magnetic cores 1 and 2 are employed having primary windings $3_1$ and $3_2$ and secondary windings $4_1$ and $4_2$ and D.C. magnetisation coils $5_1$ and $5_2$ respectively. Although these are shown separately, the two cores 1 and 2 could represent two possible magnetic flux paths in the same core. In this figure and all others showing schematic circuit diagrams all windings are assumed to be wound in the same sense with respect to their flux path or core in reading from left to right of the drawing. It will be observed in FIGURE 1 that, because of the wiring sense, a current will flow in the same direction in coils $3_1$ and $3_2$, in opposite directions in coils $4_1$ and $4_2$, and in opposite directions through coils $5_1$ and $5_2$. A D.C. source 7 is used for biassing current through coils $5_1$ and $5_2$ sufficient just to saturate cores 1 and 2. In series with the D.C. source is a high inductance choke 6. The secondary windings $4_1$ and $4_2$ are connected in series with load 8 through capacitor 9, and the series combination of load 8 and capacitor 9 is bridged by a further capacitor 10. A primary input alternating voltage is applied to terminals 11 and 12 which are connected to windings $3_1$ and $3_2$ in series. The inclusion of capacitors 9 and 10 is not essential, but one or both are generally employed so that the output circuit may be tuned to the harmonic of the primary frequency required (this is usually the second harmonic).

Figure 2:
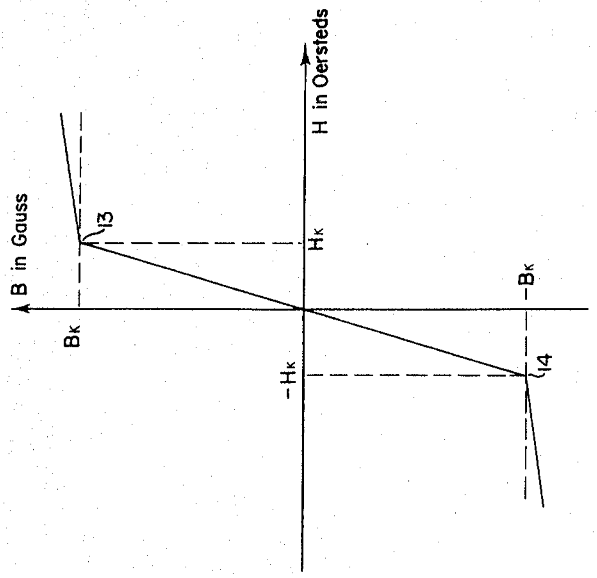
FIGURE 2 represents an idealized curve of magnetic flux density against magnetising field in a reactor core ferro-magnetic specimen.
Figures 3, 4:
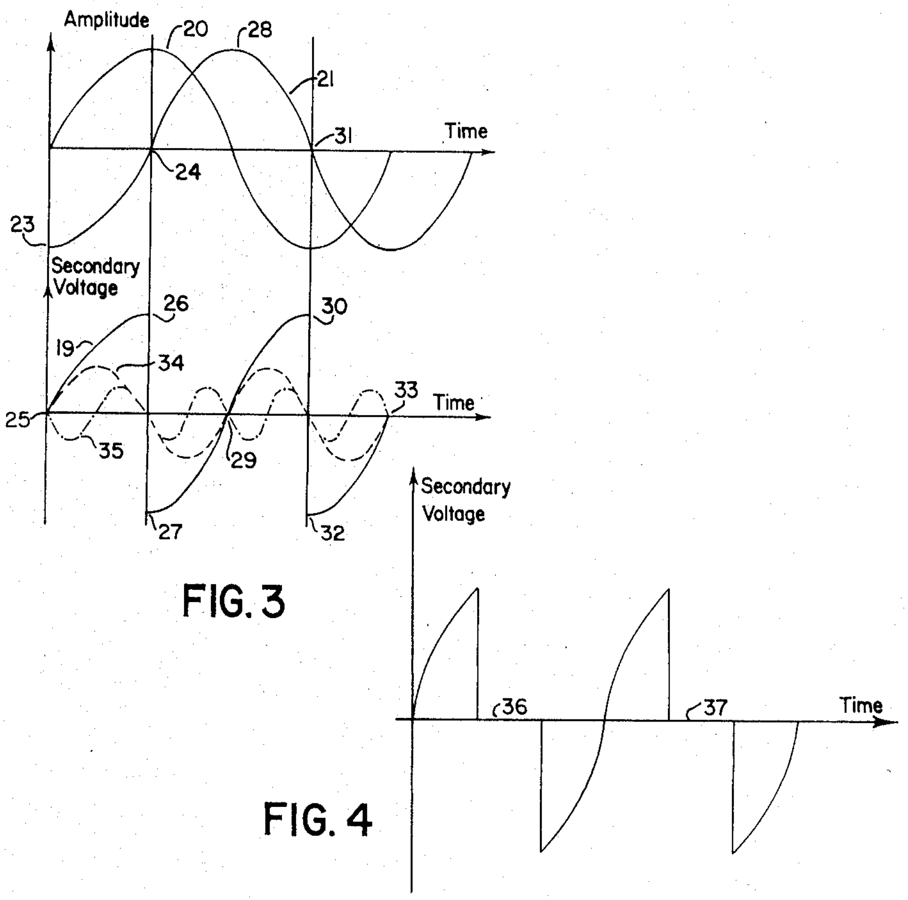
FIGURE 3 shows waveforms associated with the circuit of FIGURE 1.
FIGURE 4 represents a curve of the output in the load circuit of FIGURE 1.

Under ideal conditions of operation the magnetising current in the D.C. winding is arranged to bring the flux in each core to the knee point 13 or 14 (see FIGURE 2). A sine waveform of voltage shown by curve 20 in FIGURE 3 is then applied between terminals 11 and 12 and produces a current in the primary circuit of the form and phase relationship shown by curve 21. Let us assume that for positive half cycles of primary current core 2 becomes unsaturated and for negative half cycles it is core 1 which unsaturates. At point 23 the primary current is at its maximum negative value, its rate of change is zero, and the flux in core 1 is at its maximum negative value (positive being reckoned as the direction of magnetisation by D.C. in winding 5). There is no rate of change of flux, so the induced E.M.F. in secondary winding $4_1$ will be zero. Core 2 is fully saturated at this time. As the negative value of the primary current decreases, its rate of change increases, and so does the rate of change of flux through core 1. This will lead to an induced E.M.F. in winding 4 which will reach its maximum value at zero primary current shown by point 24. The corresponding curve for E.M.F. in winding $4_1$ is shown rising from zero at point 25 to a maximum at point 26. At point 24, assuming the ideal BH curve, core 1 staturates and core 2 immediately starts to unsaturate. The rate of change of flux in core 2 is a maximum, and therefore a maximum E.M.F. will be induced in coil $4_2$. The sense of wiring of coils $4_1$ and $4_2$ gives an E.M.F. in the secondary load circuit in the opposite direction to that produced just a moment earlier by winding $4_1$. The E.M.F. in winding $4_2$ is represented by point 27 on the curve 19. The primary current continues to rise at a continually diminishing rate of change until it reaches point 28 where it has its maximum value but zero rate of change. Over this period the E.M.F. induced in winding $4_2$ returns to zero along the curve from 27 to 29. Beyond point 28 the rate of change of primary current begins to increase negatively, and leads to a positive E.M.F. in the load circuit as shown by the curve between point 29 and 30. The primary current thereafter passes through zero at point 31, and the secondary E.M.F. jumps negatively to points 32 with the unsaturating of core 1. The secondary E.M.F. then returns to point 33 which is identical with point 25, and the cycle repeats itself. It can be seen, therefore, that an output E.M.F. is produced between terminals 13 and 14 of the form shown by curve 19. Fourier analysis of the curve 19 shows that it contains only even harmonic components of the primary exciting frequency. (Second and fourth harmonics, curves 34 and 35 are sketched in with their approximate relative amplitudes.) As a general rule it is the second harmonic which is chosen and tuning of the circuit by means of condensers 9 or 10, or both, gives a fairly clean sinusoidal output voltage of twice the input frequency.

Under operating conditions the direct magnetizing current is higher than the value indicated in the above description, which is only strictly true for an open circuited secondary. The applying of this higher direct magnetizing current has a number of effects, one being that the no-load secondary output voltage is somewhat distorted to the form shown in FIGURE 4. In this are shown periods 36 and 37 over which no secondary output is obtained, and the waveform contains odd harmonic components as well as the even ones of the ideal wave. The choke 6 also has to carry a higher direct current which reduces its reactance due to saturation effects. Thus the choke 6 must be very large if it is to prevent the flow of harmonic currents in the D.C. magnetizing circuit. It is to be noted that the output can be altered by variation of the D.C. bias for instance, if the D.C. bias current is increased above the value corresponding to $H_k$ in FIGURE 2 the open circuit output voltage is reduced, because the cores are saturated for a longer pehiod per cycle of input. Conversely, a reduction of the bias towards $H_k$ in FIGURE 2 will give a greater open circuit output voltage.

It is well-known that the requirement of a choke with a ferromagnetic core to have a high A.C. reactance whilst being capable of carrying a high direct current are two conflicting criteria. As the direct current through the choke is increased the core is brought nearer to saturation, and hence any superimposed alternating current is liable to bring the core to saturation over part of the cycle with a consequent loss of reactivity during that period.

Figure 5:
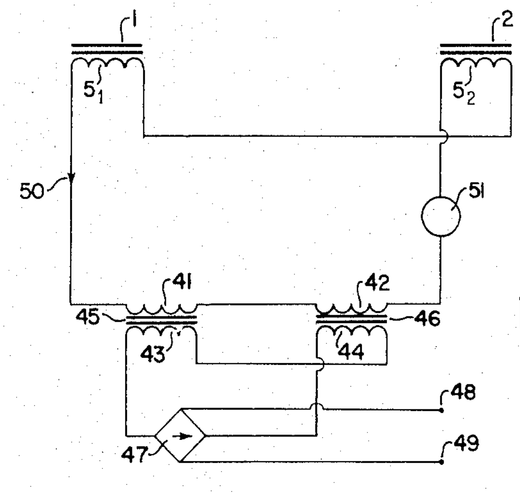
FIGURE 5 is a schematic diagram of a circuit employing a choke according to the invention.

It has been found that this problem may be confronted in the following manner. Let us consider FIGURE 5, in which are shown the cores 1 and 2 originally appearing in FIGURE 1 with the D.C. magnetizing windings $5_1$ and $5_2$. The remainder of the circuit (not shown) associated with windings $4_1$, $4_2$, $3_1$ and $3_2$ on cores 1 and 2 is assumed to be the same as that in FIGURE 1. In the circuit of FIGURE 5 the choke 6 of FIGURE 1 has been replaced by two separate series connected windings 41 and 42 on flux paths of cores 45 and 46 respectively. D.C. magnetizing windings 43 and 44 are provided upon cores 46 and 45 respectively. The cores 45 and 46 may, of course, be replaced by separate flux paths on the same core. A D.C. source 47 shown as a full wave rectifier bridge circuit, provides unidirectional current for winding 43 and 44 an application of an alternating current across terminals 48 and 49. The magnitude of the current from the bridge circuit may be varied by varying the input voltage to terminals 48 and 49, such as by means of a potentiometer circuit (not shown). The sense of the connection of the windings 43 and 44 is such that the cores 45 and 46 are magnetized in opposite directions by the direct current from source 47. A D.C. source 51, adjustable to vary both magnitude and direction of the magnetic biassing current through windings $5_1$ and $5_2$, is provided by another rectifier bridge circuit or other known means. It will be seen, therefore, that, for a given magnetizing current through windings $5_1$ and $5_2$, the current through windings 43 and 44 may be adjusted such that the net ampere turns acting on one or other of cores 45 or 46 zero depending upon the sense of the magnetizing current through windings 41 and 42 and that core will be available to deliver a maximum alternating current reactance. If the sense of the current provided by source 51 is reversed the standing flux in the second core of 45 or 46 may be reduced to zero merely by alteration of the magnitude of the input to terminals 48 or 49 and it will then provide the required A.C. reactance. This circuit is convenient because it allows for reversal of the magnetizing current through coils $5_1$ and $5_2$ without disturbing the rest of the circuit save to increase or decrease the magnetizing current through windings 43 and 44.

Figures 6, 7:
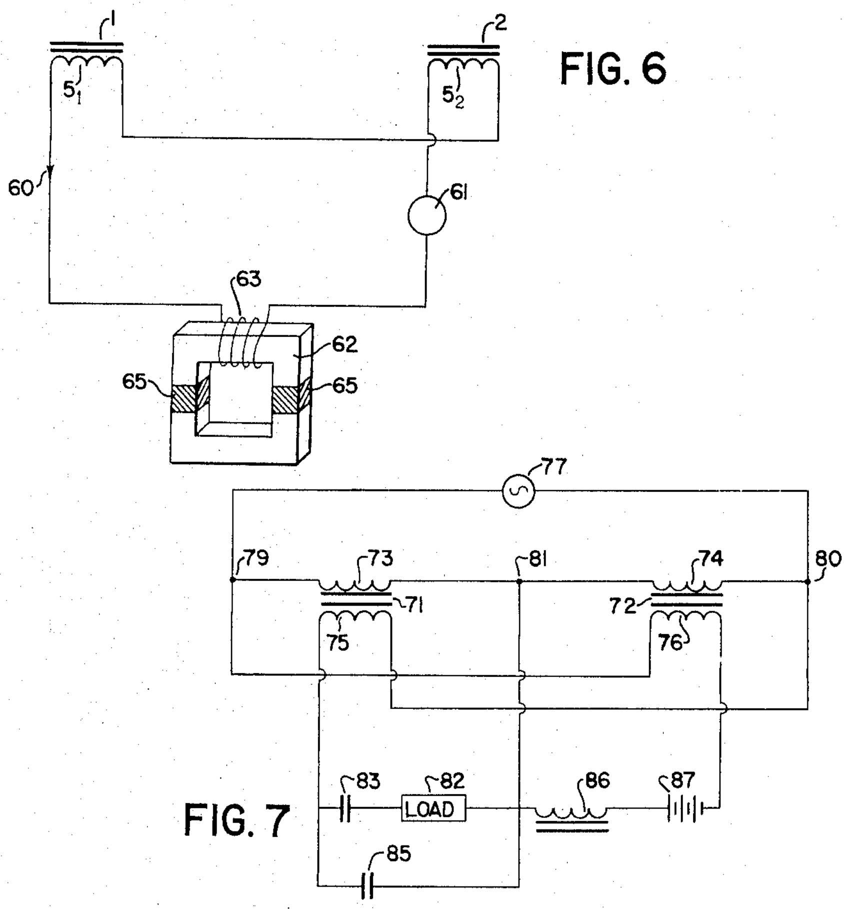
FIGURE 6 is a schematic diagram of a further circuit employing a choke according to the invention.
FIGURE 7 is a schematic diagram of a frequency multiplier circuit according to the invention.

In FIGURE 6 a circuit is shown which is somewhat more simple than the circuit of FIGURE 5 and may be used where the magnetizing current for windings $5_1$ and $5_2$ in unidirectional and substantially constant. In this circuit a choke core 62 with winding 63 is shown having one or more permanent magnets inserted in the flux path of the core to generate a magneto-motive force opposing that induced by the current from a source 61, flowing through winding 63. The gap length in which the magnets 65 are placed, and the permanent magnets are designed to bring the resultant flux in the core 62 to a suitably low value under conditions of operation, so that satisfactory A.C. reactance is provided.

In FIGURE 7 there is shown a frequency doubled in which the conventional three-winding transformers have been replaced by ones having two windings only. Two flux paths 71 and 72 are provided. Path 71 is linked by primary and secondary windings 73 and 75, flux path 72 by primary and secondary windings 74 and 76. If, as before, all windings are considered to be in the same sense with reference to their respective flux paths when passing from left to right of the figure, the right-hand end of winding 73 and the left-hand end of winding 74 are joined together at junction 81. The remaining ends 79 and 80 of windings 73 and 74 respectively are connected across an alternating current source 77. The left end of winding 73 is connected to the left end of secondary winding 76, and the right end of winding 74 is connected to the right end of secondary winding 75. The left end of winding 75 is connected to one side of the load 82 through a condenser 83, and the other side of the load is connected to junction 81. The series circuit of condenser 83 and load 82 may be bridged by a condenser 85. A series connected choke 86 and D.C. source 87 are connected between terminal 81 and the right-hand end of winding 76. It will be seen on examination of this circuit that a D.C. path is provided from source 87 running through choke 86 through primary winding 73, thence back through winding 76 to source 87. A circuit for supplying the load is provided through condenser 83 through winding 75, thence through winding 74 and back to load 82. The choke 86 could be replaced by a combination similar to that described in FIGURE 5 or 6.

Figure 8:
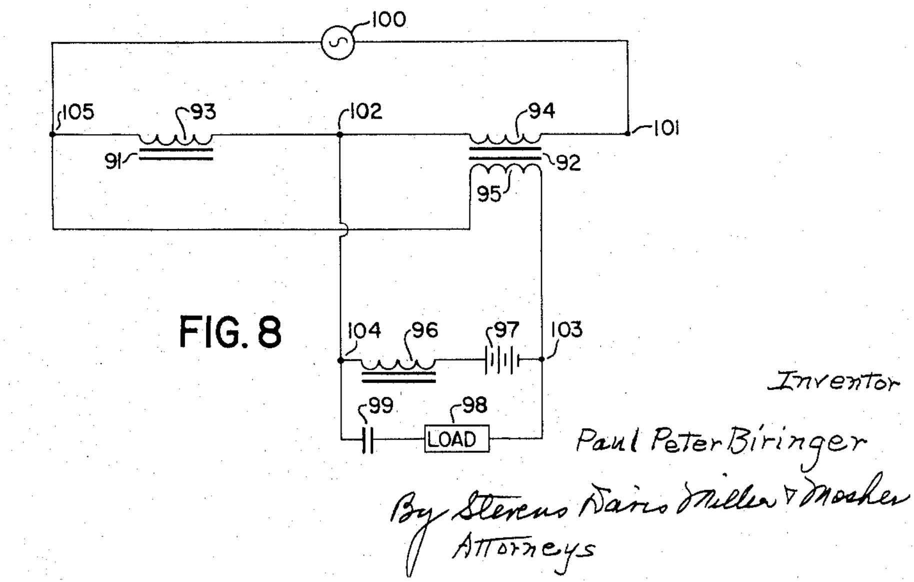
FIGURE 8 is a schematic diagram of another frequency multiplier circuit according to the invention.

FIGURE 8 shows a modification of the circuit of FIGURE 7 in which the D.C. load circuits are concurrent and only one flux path need have two windings. Two flux paths 91 and 92 are provided, path 91 linked by one winding 93, and path 92 linked by primary winding 94 and secondary 95 assumed to be wound in the same sense from left to right as shown in FIGURE 7. The right-hand end of winding 93 and the left-hand end of 94 are connected together at junction 102. The left end 105 of winding 93 and right end 101 of primary 94 are connected across an alternating current source 100. The left end of winding 95 is connected to end 105. A load 98 in series with direct current isolating condenser 99 and a D.C. source 97 in series with an alternating current choke 96 are connected in parallel between the right end of winding 95 and junction 102. It will be seen in this embodiment that the D.C. magnetizing current path and secondary load circuit path through the windings 93 and 95 are identical. Choke 96 can be replaced by either of the combinations described in FIGURE 4 or FIGURE 5. It is to be noted that decrease in volume of iron for the flux paths for the same second harmonic power output using similar chokes for the circuits shown in FIGURE 1, FIGURE 7 and FIGURE 8 are 0%, 10%, and 30% respectively. Greater improvement are possible using the special choke circuits.

Figure 9:
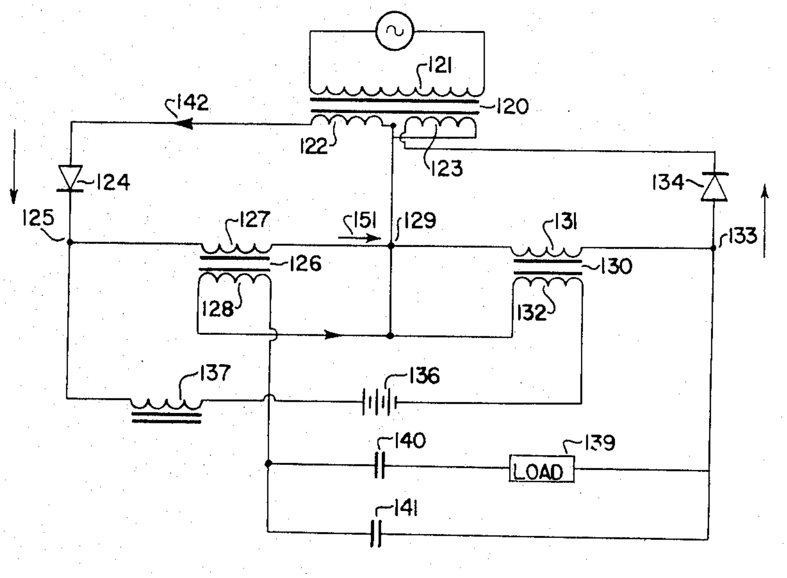
FIGURE 9 is a schematic diagram of a self-biassing frequency multiplier circuit according to the invention.

FIGURE 9 shows a self-biasing frequency doubler circuit. In this circuit two saturable flux paths 126 and 130 each have primary and secondary windings 127, 128 and 131, 132 respectively. The sense of the windings is considered to be such that a current from left to right of any winding tends to magnetize its core in a particular direction (say left to right also). The circuit is connected up as in the manner of FIGURE 7 to produce two circuits one having a load 139 interposed therein, and the other a D.C. source 136. Although the load and source are placed at different points in their circuits from those in FIGURE 7, it will be observed that much of the circuits of FIGURE 9 and that of FIGURE 7 are similar. More particularly in FIGURE 9 the right end of winding 127 and the left end of winding 131 are connected to a junction 129. The left end of winding 128 and the right end of winding 132 are also connected to junction 129. The left end of winding 132 is connected through a D.C. source 136 and a choke 137 to left end 125 of winding 127. The right end of winding 128 is connected through load 139 to the right end 133 of winding 131. Condensers 140 and 141 are for neutralizing inductive reactance in, and to tune, the load circuit, they may be omitted if desired in certain cases. The source 136 could be placed at any point in the circuit of winding 132 and 127 and the load 139 at any point in the circuit of winding 128 and 131, provided that steps were taken to avoid mutual interference between the D.C. source and the load, such as in the arangement of load and D.C. source in FIGURE 8. The choke 137 must always be in the D.C. circuit and isolation to prevent direct current flowing in the load circuit is to advantage.

The end 125 of winding 127 is supplied through a rectifier 124 from one end of a transformer winding 122 on core 120. The other end of winding 122 is returned to a junction 129. End 133 of winding 131 is supplied through a rectifier 134 from one end of a second winding 123 on core 120. The other end of winding 123 is also returned to junction 129. Rectifier 124 is connected for positive current flow to end 125 from the winding 122, and rectifier 134 for positive curent flow from end 133 to winding 123; these rectifiers are thus in opposite sense with respect to the in-phase outputs from windings 122 and 123 and current flows in the same direction through windings 127 and 128. It will be clear that one winding could replace 122 or 123 if desired, one end being connected to junction 129 and the other to feed both rectifiers 124 and 134. The arrangement shown however, prevents the development of a standing bias in the transformer core 120. A primary winding 121 fed from a source 135 is provided on transformer core 120.

Figure 10:
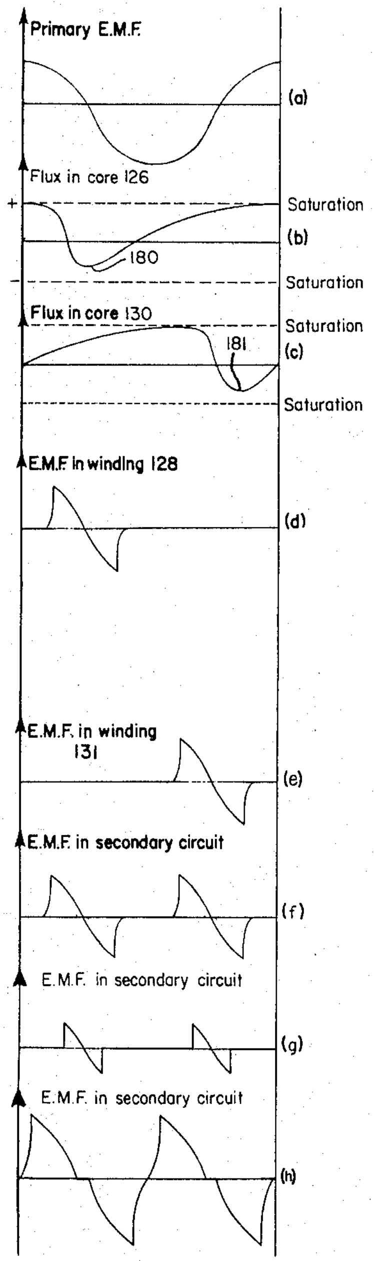
FIGURE 10 shows a series of curves of waveforms associated with the circuit of FIGURE 9.

As an explanation of the operation of the circuit of FIGURE 9, let us assume that both the D.C. and load circuits are let open. Turning now to FIGURE 10, suppose that the primary E.M.F. is as represented in FIGURE 10*a*. The primary current in each separate winding 127 and 131 is modified by the winding inductance and by the rectifier which supplies it to produce a "free-wheeling" effect so that the flux through core 126 takes the form of FIGURE 10*b*, and that through core 130 of FIGURE 10*c*. The presence of the rectifiers will not block the alternating current during the whole negative half-cycle since the core material has no remenance. The operation of the circuit thus resembles that of the flux preset type of magnetic amplifier. The wave forms of FIGURES 10*b* and 10*c* thus show pronounced changes in direction of flux in the two cores during periods spaced in time by alternate half cycles of the A.C. source E.M.F. and the two cores thus behave as though they had been independently biased. The changes in flux will produce output E.M.F. in winding 128 and back E.M.F. in 131 respectively, as shown at 10*d* and 10*e*. Due to the sense of connection of 128 and 131 in the load circuit the secondray E.M.F. will then become that of FIGURE 10*f*. The output frequency of the circuit of FIGURE 9 is thus twice that of the input. If now the D.C. control circuit is closed so that a standing magnetic bias is applied in the positive direction for cores 126 and 130, then peak 180 for FIGURE 10*b* will not dip as far negatively from positive saturation nor peak 181 for FIGURE 10*c*. The output E.M.F. in the secondary circuit is thus less as FIGURE 10*g* shows. If the magnetic bias applied by the D.C. control circuit is reversed then the output in the secondary circuit is increased as FIGURE 10*h* shows.

Figure 11:
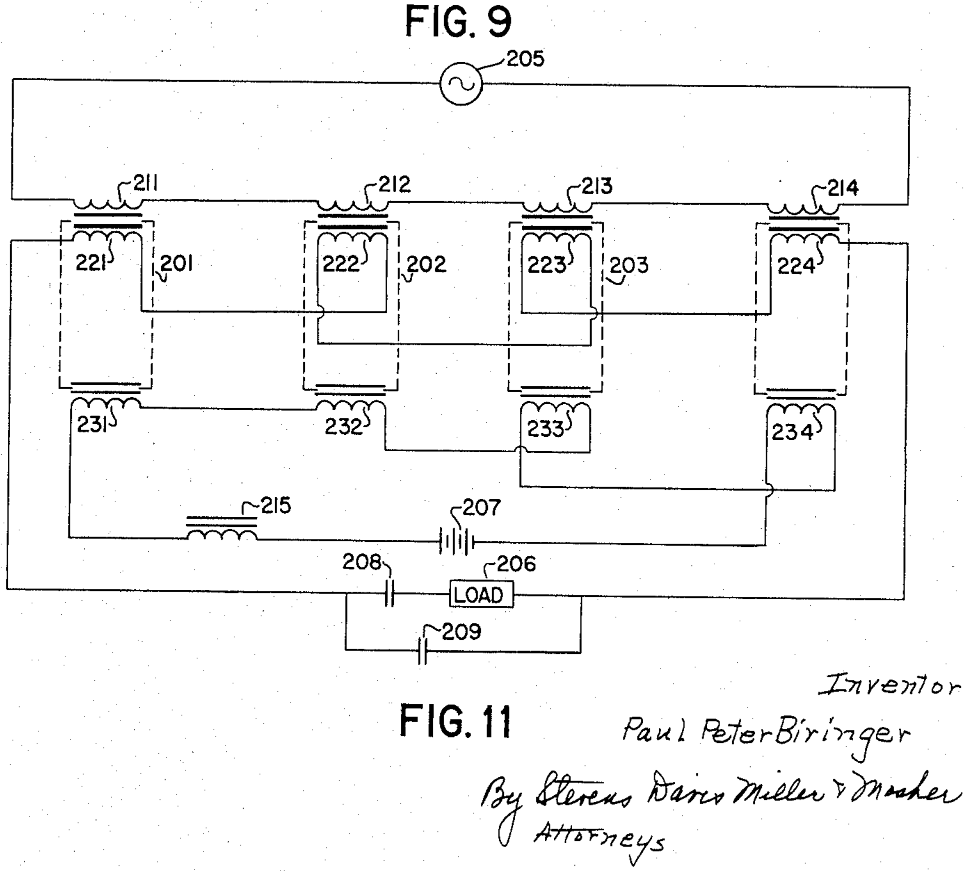
FIGURE 11 shows a further frequency multiplier circuit according to the invention.

In FIGURE 11 there is shown a circuit of a multi-unit frequency multiplier, having in this case four saturable core reactors. In this circuit the primary windings 211, 212, 213 and 214 of four saturable ractors having cores 201, 202, 203 and 204 respectively are connected in series across a source of alternating current 205. Each of cores 201, 202, 203 and 204 has wound thereon a secondary and a tertiary winding, the secondary windings being 221, 222, 223 and 224 respectively, and tertiary windings being 231, 232, 233 and 234 respectively. The connections of the secondary windings are such that if a current travels from left to right in windings 221, it then passes from right to left in winding 222, then from right to left in winding 223, and finally from left to right in winding 224. The secondary circuit is completed through a load 206. The sense of connection of the tertiary windings is such that if a current travels from left to right in the winding 231, then it travels from left to right in winding 232, then from right to left in winding 233, and finally from right to left in winding 234. The tertiary circuit is completed through a D.C. source 207, and a choke 215. Condensers 208 and 209 may be associated with the load 206 for neutralizing inductive reactance in the secondary circuit, etc. The choke 215 may be one of the hybrids described earlier for FIGURE 5 or 6.

Figure 12:
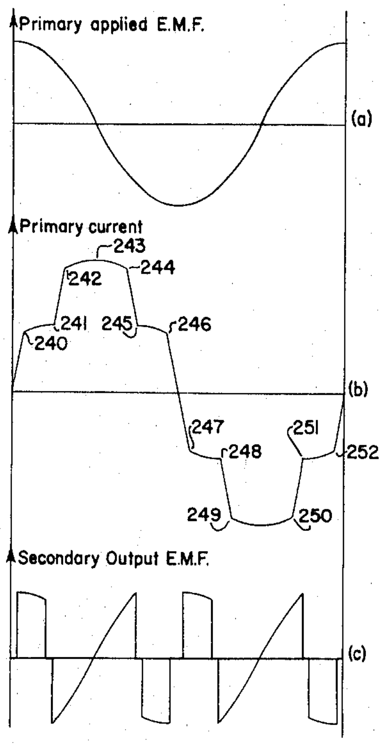
FIGURE 12 shows a series of waveforms associated with the circuit of FIGURE 11.

To understand the operation of the circuit of FIGURE 11 let us consider FIGURE 12. The applied primary E.M.F. is shown as a sine wave in FIGURE 12*a*. The desired current waveform in the primary is shown in FIGURE 12*b*. Let us assume that the number of turns of winding 231 on core 201, and the number of turns of winding 211 are such that in the presence of a fixed direct current from source 207 the primary current must rise to point 240 before core 201 starts to unsaturate. As core 201 unsaturates winding 211 will start to generate a back E.M.F. and in addition an E.M.F. will appear across winding 221. Let us assume that by the time the current has risen to 241, core 201 is again saturated, but in the oposite direction from that first considered. When core 201 saturates there will be virtually no reactance in the primary circuit, the primary current therefore rises, and we shall assume that at point 242 sufficient ampers turns are provided by the primary current at winding 212 to cause core 202 saturated by current in winding 232 to start to unsaturate. We shall assume further that the reactance offered by coil 212 on core 202 is sufficient to ensure that at peak primary current 243 core 202 does not saturate in the opposite direction to that originally due to current in winding 232. As the primary current starts to fall saturation of core 202 reoccurs at point 244, since the biasing provided by the tertiary winding 232 is now sufficient for this. The removal of the self inductance of winding 212 on core 202 from the circuit causes the primary current to drop rapidly, but at point 245 core 201 again becomes unsaturated. At point 246 core 201 saturates in the original direction, and the current continues to fall rapidly. Because of the sense of the primary E.M.F. the current falls below zero and starts to reverse. The current rises in the reverse direction until point 247 is reached. At this point 203 starts to unsaturate and the current rises slowly, until, at point 248, the core saturates in the opposite direction. Between point 249 and 250 core 204 is unsaturated, and between point 251 and 252 it is core 203 which is again unsaturated. The current then drops to zero and the cycle repeats itself.

Because of the sense in which the secondary windings 221, 222, 223 and 224 are connected the output obtained in the load circuit will be as shown in 12*c*. The outputs from windings 222 and 224 can be equated to those from 221 and 224 by suitable adjustment of the number of turns of windings 222 and 224, respectively. It will be clear to those skilled in the art that further steps of current change could be introduced by including more saturable core reactors in the circuit and in this way higher multiples of the primary E.M.F. frequency be obtained.

It will be observed that the current waveform is intrinsically made up of a number of steps which per half cycle of the input primary E.M.F. frequency equals the number of reatcor units. A variety of current output waveforms could be obtained through a suitable choice of turns ratio of the primary and D.C. windings of the separate units. In the circuit of FIGURE 11 the primary to D.C. winding turns ratio is chosen so that commutation occurs at 45° intervals of the primary cycle. During any one period one core is unsaturated and the remainder are saturated. This is to say, the unsaturated core absorbs the supply voltage over that period. During that period too, the flux in the unsaturated cores passes effectively from saturation in one direction to saturation in the other for most economical use of the equipment.

It will be understood that in all the multiplier circuits described above the primary or load current could be used to develop the voltage for the D.C. source. This could be achieved by placing the primary winding of a transformer in either the input or load circuits of any of the multipliers of FIGURES 1, 4, 5, 6, 7 or 8. Such an arrangement has the advantage that positive or negative feed-back could be employed to make a high gain or linear amplifier of the multiplier respectively.

Figure 13:
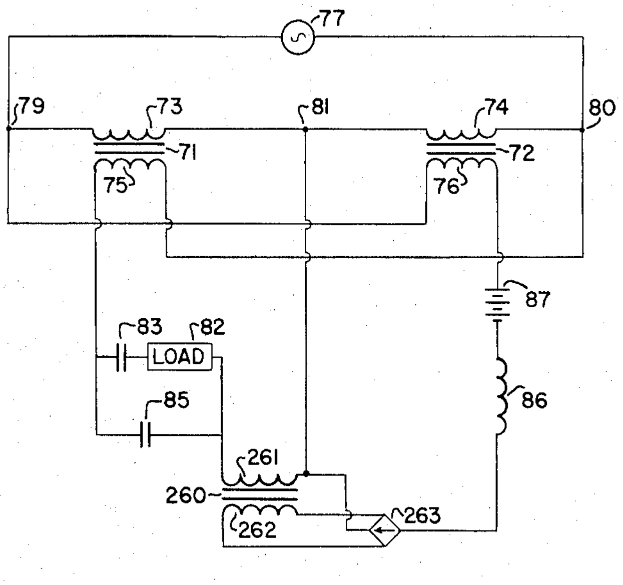
FIGURE 13 is a frequency multiplier circuit according to the invention with feed back.

The circuit of FIGURE 6 could for instance be modified to be a high gain amplifier by the circuit of FIGURE 13. In this circuit the primary winding 261 on a transformer core 260 is connected in the load circuit of FIGURE 6 between the load and junction 81. A secondary winding 262 of transformer 260 feeds a bridge rectifier network 263 arranged for positive current flow in a direction opposite to that of D.C. source 87.

Let us suppose that the cores 71 and 72 are biased beyond the knee point 13 or 14 on the BH curve of FIGURE 2. A reduction in the D.C. bias gives a greater output in the load circuit. Now an increase in amplitude of input from source 77 leads to a reduction in the D.C. bias on the cores 71 and 72 due to the feed back network. In accordance with this reduction, the amplitude of the output to the load 82 is increased above that due to the increase in input alone.

This circuit again might be modified so that winding 261 is placed in the primary circuit of source 77 and windings 73 and 74. The operation of this modification would be similar to that of the circuit of FIGURE 13, except that the D.C. bias would be derived from the primary current rather than the load current.

It will be clear to those skilled in the art by reversing the bridge network 263 in FIGURE 13, or in the modification just described, the feed back D.C. bias would become negative and the circuits would then function as amplifiers with good linearity rather than high gain.

Figure 14:
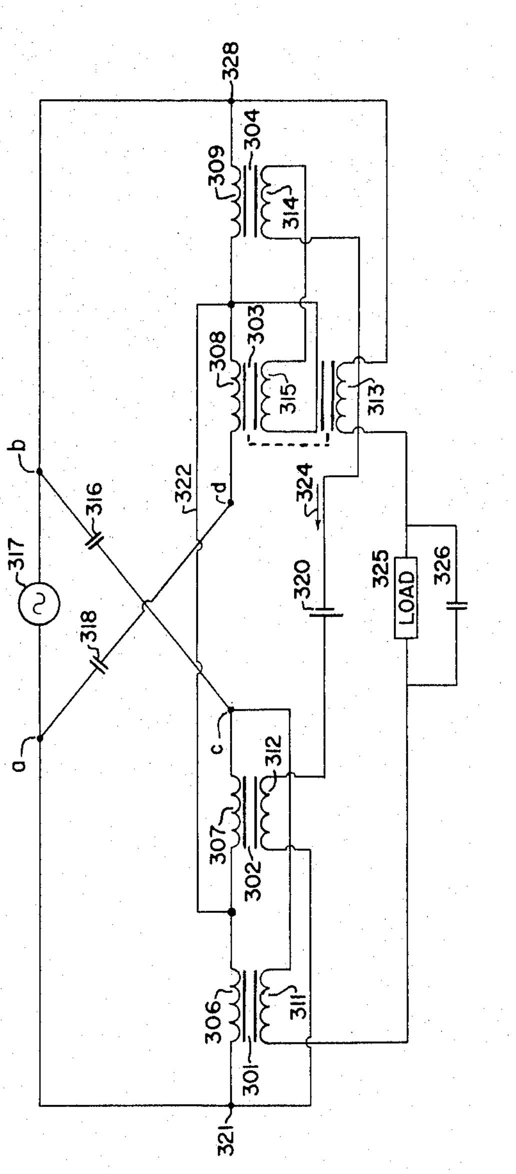
FIGURE 14 is a frequency multiplier circuit with fourth harmonic output.

Making reference now to FIGURE 14, there are shown four saturable transformers having cores 301, 302, 303 and 304 upon which are primary windings 306, 307, 308 and 309 and secondary windings 311, 312, 313 and 314 respectively. A tertiary winding 315 is provided on core 303. Windings 306 and 307 are series connected to a condenser 316 and windings 308 and 309 are series connected through a condenser 318 across a source of alternating E.M.F. 317. A D.C. magnetisation circuit is formed from a D.C. source 320 through winding 312 to the side 321 of winding 306 (connected to terminal *a* of source 317) through winding 306 to the junction of windings 306 and 307 across a bridge 322 to the junction of windings 308 and 309 through winding 315, then through winding 314 and back to source 320. A secondary circuit is formed from a load 325 (which may be by-passed by a condenser 326 for tuning and power factor correction), through winding 311 to the junction *c* between winding 307 and condenser 316, through winding 307 across bridge 322, through winding 309 to terminal 328 (connected to terminal *b* of source 317) through winding 313 and back to load 325.

Figure 15:
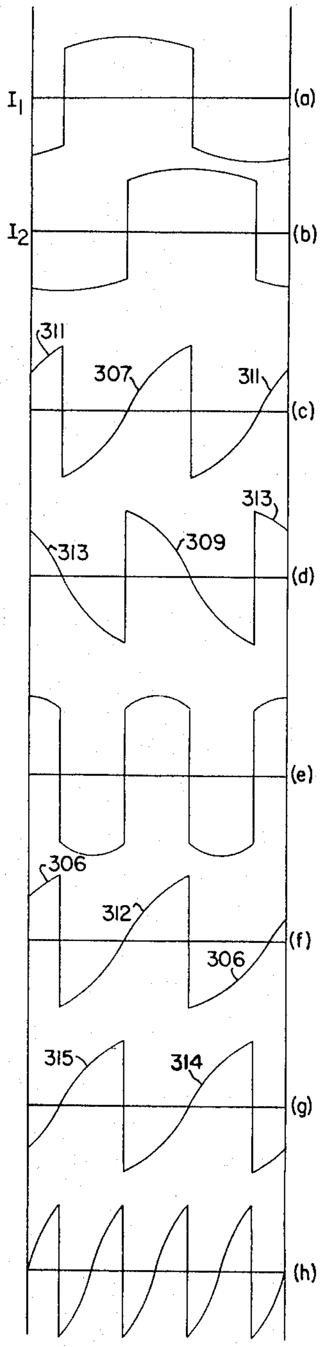
FIGURE 15 shows a series of waveforms associated with the circuit of FIGURE 14.

In this circuit it is possible, v. infra, to arrange that the currents $I_1$ and $I_2$ flowing in the two primary circuits (that of windings 306 and 307 called "A" and that of windings 308 and 309 called "B" respectively) are approximately 90° different in phase (see FIGURES 15*a* and 15*b*).

Let us assume that source 320 drives current in the direction of arrow 324 so that each core of a pair 301, 302 and 303 and 304 is substantially saturated over one half cycle of the current through its primary winding and the cores become magnetically biased. The E.M.F.'s available then in the windings 311, 307, 309 and 313 for the secondary circuit are thus as shown in FIGURES 15*c* and 15*d* which when added, give FIGURE 15*e* representing the E.M.F. in the secondary circuit. This is seen to be of second and higher harmonics of the source frequency. In the D.C. control circuit E.M.F. generated is windings 306, 312 and 315, 314 is shown in FIGURES 15*f* and 15*g* which combined in FIGURE 15*h* give the E.M.F. for the whole control circuit consisting of fourth and higher harmonics.

Figures 16, 17:
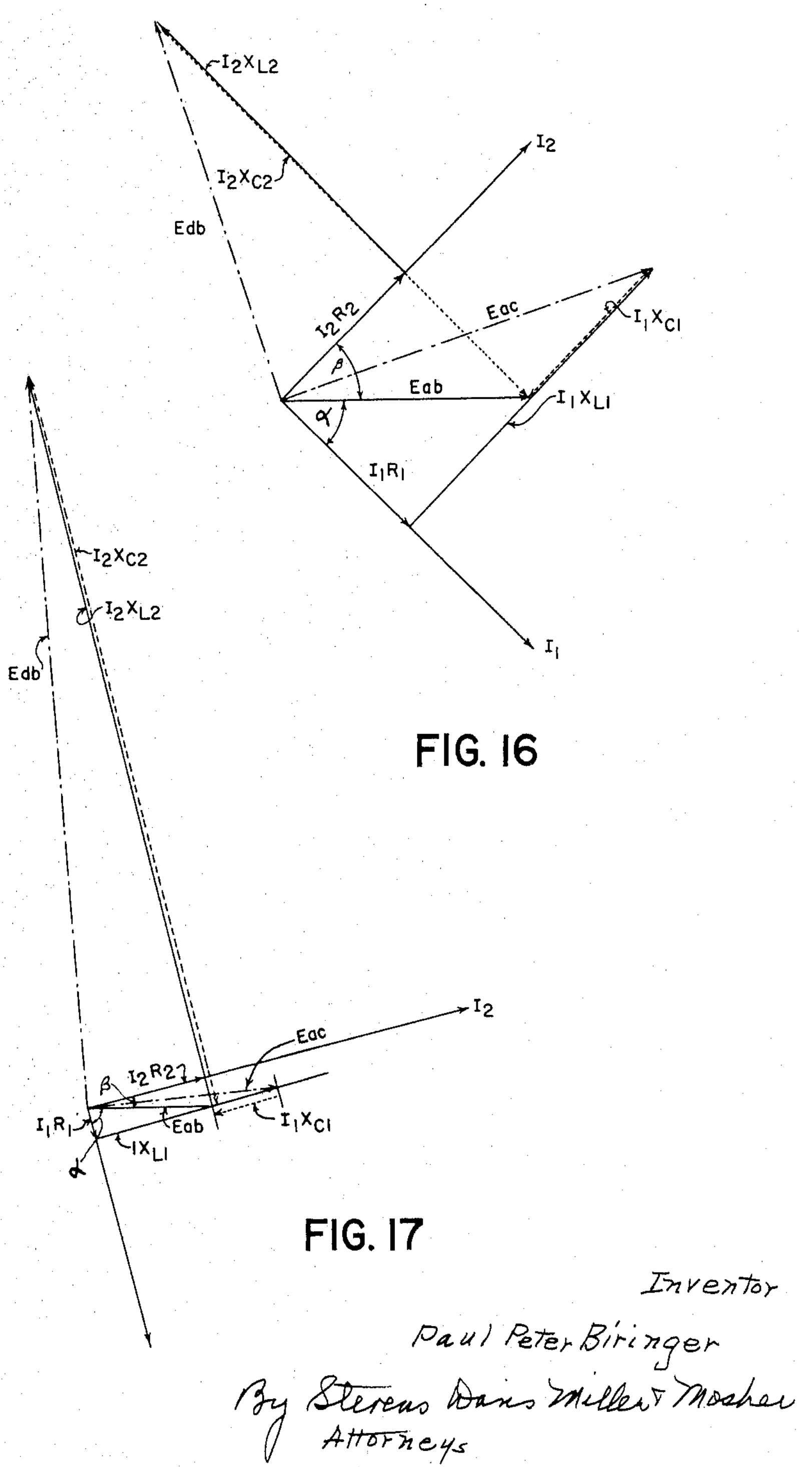
FIGURES 16 and 17 are vector diagrams for certain conditions of the circuit of FIGURE 14.

To consider the case for establishment of the currents $I_1$ and $I_2$ let us examine the situation at ideal full conditions and as depicted in the vector diagram of FIGURE 16;

Where

E*ab* is the voltage across source 317

E*ac* is the voltage across series connected windings 306 and 307 (circuit A)

E*bd* is the voltage across series connected windings 308 and 309 (circuit B)

$X_{L1}$ is the inductive reactance of windings 306 and 307 together $X_{L2}$ is the inductive reactance of windings 308 and 309 together $X_{C1}$ is the reactance of condenser 316

$X_{C2}$ is the reactance of condenser 318

$R_1$ is the apparent resistive component of the primary circuit "A"

$R_2$ is the apparent resistive component of the primary circuit "B"

$P_1$ is the power dissipated in resistance $R_1$ $P_2$ is the power dissipated in resistance $R_2$ $\alpha$ is the angular phase of $I_1$ relatively to E*ab*

$\beta$ is the angular phase of $I_2$ relatively to E*ab*

The resistive components $R_1$ and $R_2$ include the reflected resistance introduced in the primary circuits from the secondary load. In this example, the values are as given in the table below:

| $R_1$ | $X_{L1}$ | $X_{C1}$ | I.R | $\alpha$ | $P_1$ | $R_2$ | $X_{L2}$ | $X_{C2}$ | $I_2R_2$ | $\beta$ | $P_2$ |
|---|---|---|---|---|---|---|---|---|---|---|---|
| 1 | 2 | 1 | $\frac{Eab}{\sqrt{2}}$ | −45° | $\frac{Eab^2}{2}$ | 1 | 2 | 3 | $\frac{Eab}{\sqrt{2}}$ | +45° | $\frac{Eab^2}{2}$ |

By suitable choice of inductance and capacitance and effective resistance in the circuits A and B it is seen that $I_2$ can be made to lead the applied source E.M.F. by 45° and $I_2$ to lag by 45°. Since $I_1$ and $I_2$ are equal in magnitude the power factor of the frequency multiplier of FIGURE 14 is unity at ideal full load conditions. At the same time there is a 90° shift between the E.M.F.'s induced in the circuits A and B and hence the rather simplified description for FIGURES 15*e* and 15*h* adequately depicts the E.M.F.'s in the load and magnetisation circuits respectively. It can be shown, if $X_{L1}$ and $X_{L2}$ are maintained constant (by leaving the magnetising circuit current unchanged), that decreasing $R_1$ and $R_2$ leads to a larger phase difference between E*bd* and E*ac* and increasing them reduces the phase difference. If however, the reactances $X_{L1}$ and $X_{L2}$ are raised (as by decreasing the magnetising current) then the phase difference is reduced and vice versa.

FIGURE 17 is a vector diagram showing conditions where $R_1$ and $R_2$ are .5 unit. The power factor is no longer unity, but good second harmonic output is still produced in the secondary and fourth harmonic in the D.C. magnetisation circuits. The particular conditions in which only the load resistance and magnetisation current have been changed, from the first example above are as follows:

| $R_1$ | $X_{L1}$ | $X_{C1}$ | $I_1$ | $\alpha$ | $P_1$ | $R_2$ | $X_{L2}$ | $X_{C2}$ | $I_2$ | $\beta$ | $P_2$ |
|---|---|---|---|---|---|---|---|---|---|---|---|
| 0.5 | 2.88 | 1 | $\frac{Eab}{\sqrt{3.79}}$ | −75.1 | $\frac{Eab^2}{7.58}$ | 0.5 | 2.88 | 3.0 | $\frac{Eab}{\sqrt{0.264}}$ | 13.5 | $\frac{Eab^2}{.528}$ |

It is thus seen that with constant values for condenser 318 and 316 it is possible to maintain the desired 90° phase shift between E*ac* and E*bd* for changing load conditions, although the power factor at the source 317 will be less than unity for all but the ideal full load case. No core will now be saturated for an entire half cycle of primary current but nevertheless, each will suffer a greater change in flux during one half cycle than the other and satisfactory output is obtainable unless the D.C. bias is very greatly changed.

The embodiments of the invention in which an exclusive property or privilege is claimed are defined as follows:

1. A frequency multiplying circuit of the saturable core reactor type having a load applied thereto, including:

(i) a first magnetic flux path, (ii) a second magnetic flux path, (iii) a first primary winding associated with said first magnetic flux path, (iv) a second primary winding, associated with said second magnetic flux path, said first and second primary windings being connected in series, (v) a primary input alternating voltage connected across said first and second primary windings and adapted to produce alternating magnetic fluxes in said first and second magnetic flux paths, (vi) a first secondary winding associated with said first magnetic flux path and having a first secondary voltage induced there in.

(vii) a second secondary winding associated with said second magnetic flux path and having a second secondary voltage induced therein, said first secondary winding being adapted to augment the flux in said first magnetic flux path and to alternate the flux in said second flux path, one end of said first secondary winding being connected to one side of said input voltage, and one end of said secondary winding being connected to the other end of said input voltage, (viii) a source of D.C., (ix) a choke, and (x) a load condenser, said source of D.C., said choke, said load, and said load condenser being connected in series one end of the series circuit formed thereby being connected to the other end of said first secondary winding and the other end of the said series circuit being connected to the other end of said second secondary winding, the connection between said choke and said load being further connected to said connection between said first and second primary windings.

2. The apparatus of claim 1 including a condenser connected in parallel across said load and load condenser.

3. The apparatus of claim 1 wherein said choke comprises a choke core having at least one permanent magnet inserted in the flux path thereof, said choke including a winding thereon, adapted to generate a magneto-motive force which is opposed to that generated by said at least one permanent magnet thereby bringing the resultant flux in said choke core to a low value.

4. The apparatus of claim 1 wherein said choke includes:

(i) a third magnetic flux path, (ii) a fourth magnetic flux path, (iii) a third winding associated with said third magnetic flux path, (iv) a fourth winding associated with said fourth magnetic flux path, (v) a third D.C. magnetizing winding associated with said third magnetic flux path, (vi) a fourth D.C. magnetic winding associated with said fourth magnetic flux path, (vii) a further source of D.C., said further source of D.C. being adjustable for voltage and polarity and connected to said thid and fourth D.C. magnetizing windings and adapted to produce fluxes therein which augment said flux in said third magnetic flux path and to attenuate said flux in said fourth magnetic flux path.

5. A frequency multiplying circuit of the saturable core reactor type having a load applied thereto, including:

(i) a first magnetic flux path, (ii) a second magnetic flux path, (iii) a winding associated with said first magnetic flux path, (iv) a primary winding associated with said second magnetic flux path, said winding and said primary winding being connected in series, (v) secondary winding associated with said second magnetic flux path, said secondary winding being adapted to attenuate the flux on said second magnetic flux path, (vi) a source of input alternating voltage connected across said winding and said primary winding, the side of said source connected to said winding being connected to one end of said secondary winding, (vii) a source of D.C., (viii) a choke, said choke and said source of D.C. being connected in series, the series circuit formed thereby, having a first end connected to the other end of said secondary winding and having a second end connected to the connection between said windind and said primary winding, and said load being in series with a condenser forming a series circuit and said condenser and load series circuit being in parallel with said D.C. source and choke series circuit.

6. The apparatus of claim 5 wherein said choke includes a choke core having at least one permanent magnet inserted in the flux path thereof, said choke including a winding thereon adapted to generate a magneto-motive force which is opposed to that generated by said at least one permanent magnet thereby bringing the resultant flux in said choke core to a low value.

7. The apparatus of claim 5 whrein said choke means includes:

(i) a third magnetic flux path, (ii) a fourth magnetic flux path, (iii) a third winding associated with said third magnetic flux path, (iv) a fourth winding associated with said fourth magnetic flux path, (v) a third D.C. magnetizing winding associated with said third magnetic flux path, (vi) a fourth D.C. magnetic winding associated with said fourth magnetic flux path, and, (vii) a further source of D.C., said further source of D.C. being adjustable for voltage and polarity and connected to said third and fourth D.C. magnetizing windings and adapted to produce fluxes therein which augment said flux in said third magnetic flux path and to attenuate said flux in said fourth magnetic flux path.

8. A frequency multiplying circuit of the saturable core reactor type having a load applied thereto, including:

(i) first, second, and third magnetic flux paths, (ii) first, second and third primary windings associated with respective said magnetic flux paths, said first and second primary windings being connected in series, (iii) first, second and third secondary windings associated with respective said magnetic flux paths, (iv) an input alternating voltage source connected across said first and second primary windings, said source having one side connected to one end of said first secondary winding and its other side connected to one end of said second secondary winding, said load being connected between the other end of said first secondary winding and one end of said third primary winding, the other end of said third primary winding being connected to the junction between said first and second primary windings, (v) a source of D.C., (vi) a choke, and, (vii) a bridge rectifier having a pair of A.C. terminals, and negative and positive terminals, said source of D.C., said choke, said negative terminal and the other end of said second secondary windings being connected in series, said positive terminal being connected to the other end of said third primary winding, and said A.C. terminals being connected in parallel with said third secondary winding.

9. The apparatus of claim 8 further including a condenser being connected across said load.

10. The apparatus of claim 8 further including a condenser connected between the other end of said first secondary winding and said load.

11. The apparatus of claim 10 including a further condenser connected across said first mentioned condenser and said load.

References Cited by the Examiner

UNITED STATES PATENTS

| | | | |
|---|---|---|---|
| 2,218,711 | 10/1940 | Hubbard | 323—56 |
| 2,417,622 | 3/1947 | Walsh | 323—89.7 |
| 2,418,640 | 4/1947 | Huge | 321—69 |
| 2,462,322 | 2/1949 | Huge | 321—69 |
| 2,472,980 | 6/1949 | Miller et al. | 321—69 |
| 2,666,178 | 1/1954 | Kramer | 321—68 |
| 2,875,398 | 2/1959 | Stateman | 321—69 |
| 2,892,141 | 6/1959 | La Fuze | 321—69 |

FOREIGN PATENTS

| | | |
|---|---|---|
| 1,049,493 | 1/1959 | Germany. |
| 1,077,320 | 3/1960 | Germany. |
| 123,161 | 11/1948 | Sweden. |

LLOYD McCOLLUM, *Primary Examiner.*